（12） United States Patent
Fan

(10) Patent No.: US 8,729,933 B2
(45) Date of Patent: May 20, 2014

(54) FREQUENCY MULTIPLIER CIRCUIT WITH FUNCTION OF AUTOMATICALLY ADJUSTING DUTY CYCLE OF OUTPUT SIGNAL AND SYSTEM THEREOF

(71) Applicant: IPGoal Microelectronics (Sichuan) Co., Ltd., Sichuan (CN)

(72) Inventor: Fangping Fan, Sichuan (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/857,972

(22) Filed: Apr. 5, 2013

(65) Prior Publication Data

US 2013/0265087 A1  Oct. 10, 2013

(30) Foreign Application Priority Data

Apr. 5, 2012  (CN) .......................... 2012 1 0096639

(51) Int. Cl.
*H03B 19/00* (2006.01)
*H03B 19/10* (2006.01)
*H03K 5/156* (2006.01)

(52) U.S. Cl.
CPC .............. *H03B 19/10* (2013.01); *H03K 5/1565* (2013.01)

USPC .......................................... 327/119; 327/175

(58) Field of Classification Search
CPC ............................ H03B 19/10; H03K 5/1565
USPC .................. 327/119–123, 172–175
See application file for complete search history.

(56) References Cited

U.S. PATENT DOCUMENTS 3,969,678 A * 7/1976 Asahara et al. ............... 327/557

* cited by examiner

*Primary Examiner* — John Poos

(57) ABSTRACT

A frequency multiplier circuit with a function of automatically adjusting a duty cycle of an output signal includes an input terminal, a first detecting unit, a second detection unit, a duty cycle adjusting unit and a ground terminal; wherein the frequency multiplier control unit includes a first buffer, an AND gate, a first NOR gate and a second NOR gate; wherein the first detecting unit includes an inverter, a first resistance and a first capacitance; wherein the second detecting unit includes a second buffer, a second resistance and a second capacitance; wherein the duty cycle adjusting unit includes a comparator connected to the first resistance, the first capacitance, the second resistance, the second capacitance and the first buffer. The present invention also provides a frequency multiplier system thereof. The present invention is capable of automatically adjusting a duty cycle of an output signal to 50%.

10 Claims, 1 Drawing Sheet

US 8,729,933 B2

FREQUENCY MULTIPLIER CIRCUIT WITH FUNCTION OF AUTOMATICALLY ADJUSTING DUTY CYCLE OF OUTPUT SIGNAL AND SYSTEM THEREOF

BACKGROUND OF THE PRESENT INVENTION

1. Field of Invention

The present invention relates to a frequency multiplier circuit and a system thereof, and more particularly to a frequency multiplier circuit with a function of automatically adjusting a duty cycle of an output signal and a system thereof.

2. Description of Related Arts

A frequency multiplier is a circuit for adjusting a frequency of an output signal to an integer multiple of a frequency of an input signal.

With conventional technologies, a duty cycle of the output signal of the frequency multiplier usually changes with foundry corners, temperatures and supply voltages, therefore, with a combination of different foundry corners, temperatures and supply voltages, a frequency multiplier function of the frequency multiplier does not work, and a circuit structure of the conventional frequency multiplier is complicated and not suitable for cascade connection. Therefore, it is necessary to provide a frequency multiplier circuit with a simple structure and a function of automatically adjusting a duty cycle of an output signal and a system thereof.

SUMMARY OF THE PRESENT INVENTION

In view of the above, it is necessary to provide a frequency multiplier circuit with a simple structure and a function of automatically adjusting a duty cycle of an output signal and a system thereof.

Accordingly, in order to accomplish the above objects, the present invention comprises:

a frequency multiplier circuit with the function of automatically adjusting a duty cycle of an output signal, wherein the frequency multiplier circuit with the function of automatically adjusting a duty cycle of an output signal comprises:

an input terminal, a frequency multiplier control unit connected to the input terminal, an output terminal connected to the frequency multiplier control unit, a first detecting unit connected to the frequency multiplier control unit and the output terminal, a second detection unit connected to the frequency multiplier control unit and the output terminal, a duty cycle adjusting unit connected to the first detecting unit, the second detecting unit and the frequency multiplier control unit, and a ground terminal connected to the first detecting unit and the second detecting unit;

wherein the frequency multiplier control unit comprises:

a first buffer connected to the input terminal, an AND gate connected to the input terminal and the first buffer, a first NOR gate connected to the input terminal and the first buffer, and a second NOR gate connected to the AND gate and the first NOR gate;

wherein the first detecting unit comprises:

an inverter connected to the second NOR gate and the output terminal, a first resistance connected to the inverter, and a first capacitance connected to the first resistance;

wherein the second detecting unit comprises:

a second buffer connected to the second NOR gate and the output terminal, a second resistance connected to the second buffer, and a second capacitance connected to the second resistance;

wherein the duty cycle adjusting unit comprises a comparator connected to the first resistance, the first capacitance, the second resistance, the second capacitance and the first buffer.

The present invention also provided a frequency multiplier system with a function of automatically adjusting a duty cycle of an output signal according to another preferred embodiment, wherein the frequency multiplier system with the function of automatically adjusting a duty cycle of an output signal comprises:

an input terminal, a frequency multiplier control unit connected to the input terminal for realizing a frequency multiplier function, an output terminal connected to the frequency multiplier control unit, a first detecting unit connected to the frequency multiplier control unit and the output terminal, a second detection unit connected to the frequency multiplier control unit and the output terminal, a duty cycle adjusting unit connected to the first detecting unit, the second detecting unit and the frequency multiplier control unit, and a ground terminal connected to the first detecting unit and the second detecting unit;

wherein the first detecting unit is utilized for detecting a first duty cycle of a first signal out phase with an output signal from the output terminal, converting the first duty cycle into a first voltage and sending the first voltage to the duty cycle adjusting unit, the second detecting unit is utilized for detecting a second duty cycle of a second signal in phase with the output signal from the output terminal, converting the second duty cycle into a second voltage and sending the second voltage to the duty cycle adjusting unit, the duty cycle adjusting unit compares the first voltage outputted by the first detecting unit with the second voltage outputted by the second detecting unit for obtaining a difference value in such a manner that a control voltage is generated and sent to the frequency multiplier control unit for realizing an automatic adjustment of the duty cycle of the output signal till the first voltage equals to the second voltage.

Therefore, compared to conventional technologies, the present invention provides the frequency multiplier circuit with a function of automatically adjusting a duty cycle of an output signal and the system thereof which are capable of automatically adjusting the duty cycle of the output signal to 50% in such a manner that the duty cycle of the output signal does not change with foundry corners, temperatures or supply voltages, and realization of the frequency multiplier function is ensured, additionally, the circuit structure of the present invention is simple and is suitable for cascade connection.

These and other objectives, features, and advantages of the present invention will become apparent from the following detailed description, the accompanying drawings, and the appended claims.

DETAILED DESCRIPTION OF THE PREFERRED EMBODIMENT

Figure 1:
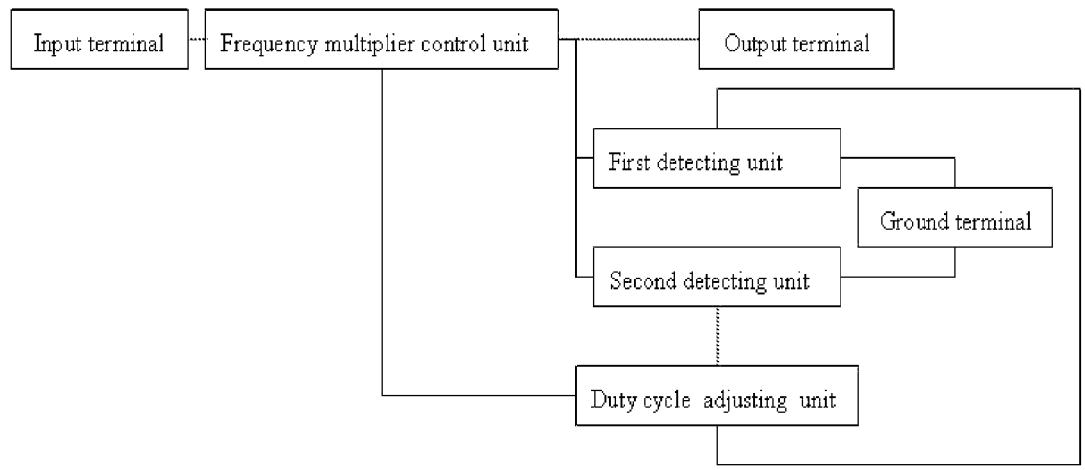
FIG. 1 is a system schematic view of a frequency multiplier system with a function of automatically adjusting a duty cycle of an output signal according to a preferred embodiment of the present invention.

Referring to FIG. 1 of the drawings, a frequency multiplier system with a function of automatically adjusting a duty cycle of an output signal according to a preferred embodiment of the present invention is illustrated, comprising:
an input terminal,
a frequency multiplier control unit connected to the input terminal,
an output terminal connected to the frequency multiplier control unit,
a first detecting unit connected to the frequency multiplier control unit and the output terminal,
a second detection unit connected to the frequency multiplier control unit and the output terminal,
a duty cycle adjusting unit connected to the first detecting unit, the second detecting unit and the frequency multiplier control unit, and
a ground terminal connected to the first detecting unit and the second detecting unit.

Figure 2:
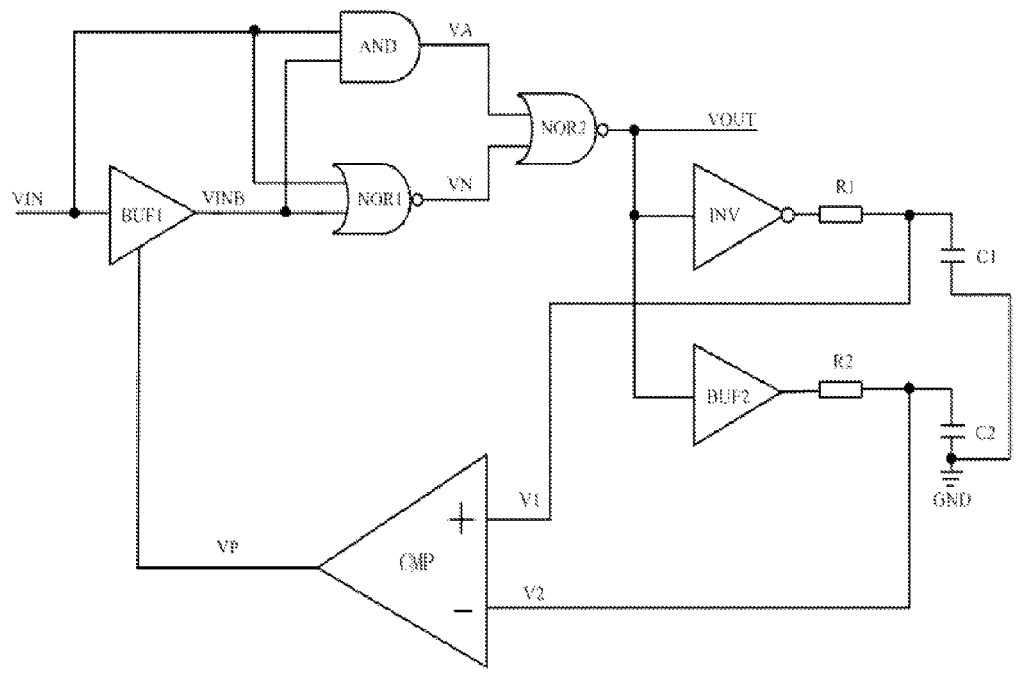
FIG. 2 is a circuit diagram of a frequency multiplier circuit with a function of automatically adjusting a duty cycle of an output signal according to another preferred embodiment of the present invention.

Referring to FIG. 2 of the drawings, a frequency multiplier circuit with a function of automatically adjusting a duty cycle of an output signal according to another preferred embodiment of the present invention is illustrated, wherein an input terminal is embodied as VIN; a frequency multiplier control unit comprises a first buffer BUF1, an AND gate AND, a first NOR gate NOR1 and a second NOR gate NOR2; an output terminal is embodied as VOUT; a first detecting unit comprises a inverter INV, a first resistance R1 and a first capacitance C1; a second detecting unit comprises a second buffer BUF2, a second resistance R2 and a second capacitance C2; a duty cycle adjusting unit comprises a comparator CMP; a ground terminal is a ground terminal GND.

The frequency multiplier control unit is utilized for realizing a frequency multiplier function in such a manner that a frequency of an output signal is adjusted to an integer multiple of a frequency of an input signal, in the preferred embodiments, the frequency multiplier circuit with a function of automatically adjusting a duty cycle of an output signal and the system thereof are utilized for realizing a frequency doubling function; the first detecting unit is utilized for detecting a first duty cycle of a first signal out phase with an output signal of the output terminal and converting the first duty cycle into a first voltage V1 and sending the first voltage V1 to the duty cycle adjusting unit, the second detecting unit is utilized for detecting a second duty cycle of a second signal in phase with the output signal of the output terminal and converting the second duty cycle into a second voltage V2 and sending the second voltage V2 to the duty cycle adjusting unit; the duty cycle adjusting unit compares the first voltage V1 outputted by the first detecting unit with the second voltage V2 outputted by the second detecting unit for obtaining a difference value in such a manner that a control voltage VP is generated and sent to the frequency multiplier control unit for realizing an automatic adjustment of the duty cycle of the output signal till the first voltage V1 equals to the second voltage V2.

A circuit connection of the frequency multiplier circuit with a function of automatically adjusting a duty cycle of an output signal according to the preferred embodiment of the present invention is illustrated, wherein the input terminal VIN is connected to a first input terminal of the AND gate AND, a first input terminal of the first NOR gate NOR1 and an input terminal of the first buffer BUF1, an output terminal of the first buffer BUF1 is connected to a second input terminal of the AND gate AND and a second input terminal of the first NOR gate NOR1, and sends a voltage VINB to the second input terminal of the AND gate AND and the second input terminal of the first NOR gate NOR1; an output terminal of the AND gate AND is connected to a first input terminal of the second NOR gate NOR2, and sends a voltage VA to the first input terminal of the first input terminal of the second NOR gate NOR2, an output terminal of the first NOR gate NOR1 is connected to a second input terminal of the second NOR gate NOR2, and sends a voltage VN to the second input terminal of the second NOR gate NOR2, an output terminal of the second NOR gate NOR2 is connected to the output terminal VOUT, an input terminal of the inverter INV and an input terminal of the second buffer BUF2; an output terminal of the inverter INV is connected to a first end of the first resistance R1, a second end of the first resistance R1 is connected to a first end of the first capacitance C1 and a non-inverting input terminal of the comparator CMP, and sends the first voltage V1 to the non-inverting input terminal of the comparator CMP, the output terminal of the second buffer BUF2 is connected to a first end of the second resistance R2, a second end of the second resistance R2 is connected to a first end of the second capacitance C2 and an inverting input terminal of the comparator CMP, and sends the second voltage V2 to the inverting input terminal of the comparator CMP, a second end of the first capacitance C1 and a second end of the second capacitance C2 are all connected to the ground terminal GND; an output terminal of the comparator CMP is connected to a control terminal of the first buffer BUF1, and sends the control voltage VP to the control terminal of the first buffer BUF1.

The frequency multiplier circuit with a function of automatically adjusting a duty cycle of an output signal and the system thereof according to the preferred embodiment of the present invention is utilized for realizing the frequency doubling function, that is to say, the frequency of the output signal from the output terminal is twice as high as the frequency of the input signal from the input terminal, wherein detailed working principles are as follows:

the frequency multiplier control unit is utilized for realizing a frequency doubling function, wherein a delay time of the first buffer BUF1 is adjustable, the control terminal of the first buffer BUF1 is controlled by the control voltage VP from the output terminal of the comparator CMP; the first resistance of the first detecting unit equals to the second resistance of the second detecting unit, the first capacitance of the first detecting unit equals to the second capacitance of the second detecting unit, the first detecting unit detects the first duty cycle of the first signal out phase with the output signal from the output terminal, converts the first duty cycle into a first voltage V1 and sends the first voltage V1 to the duty cycle adjusting unit, the second detecting unit detects a second duty cycle of a second signal in phase with the output signal from the output terminal, converts the second duty cycle into a second voltage V2 and sends the second voltage V2 to the duty cycle adjusting unit, the duty cycle adjusting unit compares the first voltage V1 outputted by the first detecting unit with the second voltage V2 outputted by the second detecting unit for obtaining a difference value in such a manner that a control voltage VP is generated and sent to the first buffer BUF1, the duty cycle of the output signal from the output terminal is adjusted by changing the delay time of the first buffer BUF1.

The function of automatically adjusting a duty cycle of an output signal is analyzed under three conditions:

a) if the duty cycle of the output signal from the output terminal VOUT is less than 50%, a value of the first voltage V1 is certainly higher than a value of the second voltage V2, and the control voltage VP outputted by the comparator CMP rises, the delay time Tdelay of the first buffer BUF1 is set to increase with an increase of the control voltage VP, and the voltage VINB delays more compared with the input signal from the input terminal VIN, a duty cycle of the voltage VA outputted by the AND gate AND decreases, a duty cycle of the voltage VN outputted by the first NOR gate NOR1 decreases, therefore, the duty cycle of a voltage outputted by the second NOR gate NOR2 increases, that is to say, the duty cycle of the output signal from the output terminal VOUT increases; the duty cycle of the output signal from the output terminal VOUT is increased by adjusting a feedback loop, if the duty cycle of the output signal from the output terminal VOUT is 50%, the value of the first voltage V1 certainly equals to the value of the second voltage V2, and the control voltage VP remains, that is to say, the delay time Tdelay of the first buffer BUF1 remains, and the whole feedback loop remains stable;

b) if the duty cycle of the output signal from the output terminal VOUT is more than 50%, the value of the first voltage V1 is certainly lower than the value of the second voltage V2, and the control voltage VP outputted by the comparator CMP lows, the delay time Tdelay of the first buffer BUF1 is set to decrease with a decrease of the control voltage VP, and the voltage VINB delays less compared with the input signal from the input terminal VIN, the duty cycle of the voltage VA outputted by the AND gate AND increases, the duty cycle of the voltage VN outputted by the first NOR gate NOR1 increases, therefore, the duty cycle of the voltage outputted by the second NOR gate NOR2 decreases, that is to say, the duty cycle of the output signal from the output terminal VOUT decreases; the duty cycle of the output signal from the output terminal VOUT is decreased by adjusting the feedback loop, if the duty cycle of the output signal from the output terminal VOUT is 50%, the value of the first voltage V1 certainly equals to the value of the second voltage V2, and the control voltage VP remains, that is to say, the delay time Tdelay of the first buffer BUF1 remains, and the whole feedback loop remains stable;

c) if the duty cycle of the output signal from the output terminal VOUT is 50%, the value of the first voltage V1 certainly equals to the value of the second voltage V2, and the control voltage VP outputted by the comparator CMP remains, that is to say, the delay time Tdelay of the first buffer BUF1 remains, and the whole feedback loop remains stable; therefore, the duty cycle of the output signal from the output terminal VOUT remains 50%.

Thus it can be seen that the frequency multiplier circuit with a function of automatically adjusting a duty cycle of an output signal and the system thereof are capable of automatically adjusting the duty cycle of the output signal to 50% in such a manner that the duty cycle of the output signal does not change with foundry corners, temperatures and supply voltages, and realization of the frequency multiplier function is ensured, additionally, a circuit structure of the present invention is simple and is suitable for cascade connection in such a manner as to realize frequency quadrupling, frequency octupling, etc.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A frequency multiplier circuit with a function of automatically adjusting a duty cycle of an output signal, comprising:
an input terminal,
a frequency multiplier control unit connected to said input terminal,
an output terminal connected to said frequency multiplier control unit,
a first detecting unit connected to said frequency multiplier control unit and said output terminal,
a second detection unit connected to said frequency multiplier control unit and said output terminal,
a duty cycle adjusting unit connected to said first detecting unit, said second detecting unit and said frequency multiplier control unit, and
a ground terminal connected to said first detecting unit and said second detecting unit;
wherein said frequency multiplier control unit comprises:
a first buffer connected to said input terminal,
an AND gate connected to said input terminal and said first buffer,
a first NOR gate connected to said input terminal and said first buffer, and
a second NOR gate connected to said AND gate and said first NOR gate;
wherein said first detecting unit comprises:
an inverter connected to said second NOR gate and said output terminal,
a first resistance connected to said inverter, and
a first capacitance connected to said first resistance;
wherein said second detecting unit comprises
a second buffer connected to said second NOR gate and said output terminal,
a second resistance connected to said second buffer, and
a second capacitance connected to said second resistance;
wherein said duty cycle adjusting unit comprises a comparator connected to said first resistance, said first capacitance, said second resistance, said second capacitance and said first buffer.

2. The frequency multiplier circuit with a function of automatically adjusting a duty cycle of an output signal, as recited in claim 1, wherein said input terminal is connected to a first input terminal of said AND gate, a first input terminal of said first NOR gate and an input terminal of said first buffer, an output terminal of said first buffer is connected to a second input terminal of said AND gate and a second input terminal of said first NOR gate.

3. The frequency multiplier circuit with a function of automatically adjusting a duty cycle of an output signal, as recited in claim 1, wherein an output terminal of said AND gate is connected to a first input terminal of said second NOR gate, an output terminal of said first NOR gate is connected to a second input terminal of said second NOR gate, an output terminal of said second NOR gate is connected to said output terminal, an input terminal of said inverter and an input terminal of said second buffer.

4. The frequency multiplier circuit with a function of automatically adjusting a duty cycle of an output signal, as recited in claim 3, wherein an output terminal of said inverter is connected to a first end of said first resistance, a second end of said first resistance is connected to a first end of said first capacitance and a non-inverting input terminal of said comparator, said output terminal of said second buffer is connected to a first end of said second resistance, a second end of said second resistance is connected to a first end of said second capacitance and an inverting input terminal of said comparator, a second end of said first capacitance and a second end of said second capacitance are all connected to said ground terminal.

5. The frequency multiplier circuit with a function of automatically adjusting a duty cycle of an output signal, as recited in claim 4, wherein an output terminal of said comparator is connected to a control terminal of said first buffer, and sends said control voltage to said control terminal of said first buffer.

6. The frequency multiplier circuit with a function of automatically adjusting a duty cycle of an output signal, as recited in claim 1, wherein said first detecting unit detects a first duty cycle of a first signal out phase with said output signal from said output terminal, converts said first duty cycle into a first voltage and sends said first voltage to said duty cycle adjusting unit, said second detecting unit detects a second duty cycle of a second signal in phase with said output signal from said output terminal, converts said second duty cycle into a second voltage and sends said second voltage to said duty cycle adjusting unit.

7. The frequency multiplier circuit with a function of automatically adjusting a duty cycle of an output signal, as recited in claim 6, wherein said duty cycle adjusting unit compares said first voltage outputted by said first detecting unit with said second voltage outputted by said second detecting unit for obtaining a difference value in such a manner that a control voltage is generated and sent to said first buffer for realizing an automatic adjustment of a duty cycle of said output signal.

8. A frequency multiplier system with a function of automatically adjusting a duty cycle of an output signal, comprising:
   an input terminal,
   a frequency multiplier control unit connected to said input terminal for realizing a frequency multiplier function,
   an output terminal connected to said frequency multiplier control unit,
   a first detecting unit connected to said frequency multiplier control unit and said output terminal,
   a second detection unit connected to said frequency multiplier control unit and said output terminal,
   a duty cycle adjusting unit connected to said first detecting unit, said second detecting unit and said frequency multiplier control unit, and
   a ground terminal connected to said first detecting unit and said second detecting unit;
   wherein said first detecting unit is utilized for detecting a first duty cycle of a first signal out phase with an output signal from said output terminal, converting said first duty cycle into a first voltage and sending said first voltage to said duty cycle adjusting unit, said second detecting unit is utilized for detecting a second duty cycle of a second signal in phase with said output signal from said output terminal, converting said second duty cycle into a second voltage and sending said second voltage to said duty cycle adjusting unit, said duty cycle adjusting unit compares said first voltage outputted by said first detecting unit with said second voltage outputted by said second detecting unit for obtaining a difference value in such a manner that a control voltage is generated and sent to said frequency multiplier control unit for realizing an automatic adjustment of said duty cycle of said output signal till said first voltage equals to said second voltage.

9. The frequency multiplier system with a function of automatically adjusting a duty cycle of an output signal, as recited in claim 8, wherein said frequency multiplier control unit comprises:
   a first buffer connected to said input terminal,
   an AND gate connected to said input terminal and said first buffer,
   a first NOR gate connected to said input terminal and said first buffer, and
   a second NOR gate connected to said AND gate and said first NOR gate.

10. The frequency multiplier system with a function of automatically adjusting a duty cycle of an output signal, as recited in claim 9, wherein said first detecting unit comprises:
   an inverter connected to said second NOR gate and said output terminal,
   a first resistance connected to said inverter, and
   a first capacitance connected to said first resistance;
   wherein said second detecting unit comprises:
   a second buffer connected to said second NOR gate and said output terminal,
   a second resistance connected to said second buffer, and
   a second capacitance connected to said second resistance;
   wherein said duty cycle adjusting unit comprises a comparator connected to said first resistance, said first capacitance, said second resistance, said second capacitance and said first buffer.

* * * * *